(12) United States Patent
Cramer et al.

(10) Patent No.: US 11,099,489 B2
(45) Date of Patent: Aug. 24, 2021

(54) METHOD OF MEASURING A PARAMETER OF A LITHOGRAPHIC PROCESS, METROLOGY APPARATUS

(71) Applicant: ASML Netherlands B.V., Veldhoven (NL)

(72) Inventors: Hugo Augustinus Joseph Cramer, Eindhoven (NL); Hilko Dirk Bos, Utrecht (NL); Erik Johan Koop, Eindhoven (NL); Armand Eugene Albert Koolen, Nuth (NL); Han-Kwang Nienhuys, Utrecht (NL); Alessandro Polo, Arendonk (BE); Jin Lian, Eindhoven (NL); Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 69 days.

(21) Appl. No.: 16/712,862

(22) Filed: Dec. 12, 2019

(65) Prior Publication Data
US 2020/0192231 A1 Jun. 18, 2020

(30) Foreign Application Priority Data
Dec. 13, 2018 (EP) ..................... 18212262

(51) Int. Cl.
*G03F 7/20* (2006.01)
*G01N 21/47* (2006.01)
(Continued)

(52) U.S. Cl.
CPC ......... *G03F 7/70683* (2013.01); *G01N 21/47* (2013.01); *G01N 21/956* (2013.01);
(Continued)

(58) Field of Classification Search
CPC .. G01N 21/47; G01N 21/956; G01N 21/9501; G03F 7/70683; G03F 7/2004; G03F 7/70633; G03F 7/70616
See application file for complete search history.

(56) References Cited

U.S. PATENT DOCUMENTS

| 5,903,594 A | * | 5/1999 | Saulnier | ................. | H04B 3/546 |
| | | | | | 375/130 |
| 6,564,184 B1 | * | 5/2003 | Eriksson | ............. | G10L 21/0208 |
| | | | | | 704/222 |

(Continued)

FOREIGN PATENT DOCUMENTS

WO  WO 2017/153130 A1  9/2017

OTHER PUBLICATIONS

Wikipedia, "Fabry-Pérot interferometer," last edited Jan. 2, 2020; 15 pages.
(Continued)

*Primary Examiner* — Michael C Bryant
(74) *Attorney, Agent, or Firm* — Sterne, Kessler, Goldstein & Fox P.L.L.C.

(57) ABSTRACT

The disclosure relates to measuring a parameter of a lithographic process and a metrology apparatus. In one arrangement, radiation from a radiation source is modified and used to illuminate a target formed on a substrate using the lithographic process. Radiation scattered from a target is detected and analyzing to determine the parameter. The modification of the radiation comprises modifying a wavelength spectrum of the radiation to have a local minimum between a global maximum and a local maximum, wherein the power spectral density of the radiation at the local minimum is less than 20% of the power spectral density of the radiation at the global maximum and the power spectral density of the radiation at the local maximum is at least 50%

(Continued)

US 11,099,489 B2

Page 2 of the power spectral density of the radiation at the global maximum.

20 Claims, 8 Drawing Sheets

(51) Int. Cl.
G01N 21/956 (2006.01)
G01N 21/95 (2006.01)

(52) U.S. Cl.
CPC ........ G03F 7/2004 (2013.01); G03F 7/70633 (2013.01); *G01N 21/9501* (2013.01)

(56) References Cited

U.S. PATENT DOCUMENTS

| | | |
|---|---|---|
| 2008/0239265 A1 | 10/2008 | Den Boef |
| 2014/0203080 A1* | 7/2014 | Hintz ................. F41G 3/08 235/404 |
| 2016/0143538 A1* | 5/2016 | Kumar ............... A61B 5/02427 600/476 |
| 2018/0017881 A1 | 1/2018 | Van Der Schaar et al. |
| 2018/0292326 A1 | 10/2018 | Manassen et al. |
| 2018/0321597 A1 | 11/2018 | Javaheri et al. |

OTHER PUBLICATIONS

Johnson et al., "Ultraviolet Filters: Past and Present," Photonics Handbook, accessed Jan. 21, 2020; 10 pages.

International Search Report and Written Opinion of the International Searching Authority directed to related International Patent Application No. PCT/EP2019/081836, dated Feb. 4, 2020; 10 pages.

* cited by examiner

METHOD OF MEASURING A PARAMETER OF A LITHOGRAPHIC PROCESS, METROLOGY APPARATUS

FIELD

The present description relates to measuring a parameter of a lithographic process and a metrology apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Various forms of scatterometers have been developed for use in the lithographic field. These devices direct a beam of radiation onto a target and measure one or more properties of the scattered radiation to determine a parameter of interest, such as overlay. Interference effects in the target can cause the sensitivity of measurements of the parameter of interest to vary as a function of the wavelength, incident angle and/or azimuthal angle of the radiation. To provide high sensitivity in such a scenario it is possible to make multiple measurements at different wavelengths, but this increases system complexity, increases measurement time and/or reduced metrology throughput.

SUMMARY

It is desirable to improve measurements of parameters of interest in contexts where sensitivity varies significantly with wavelength.

According to an aspect, there is provided a method of measuring a parameter of a lithographic process, comprising: modifying radiation from a radiation source and illuminating with the modified radiation a target formed on a substrate using the lithographic process; and detecting radiation scattered from the target and analyzing the detected radiation to determine the parameter, wherein: the modification of the radiation comprises modifying a wavelength spectrum of the radiation to have a local minimum between a global maximum and a local maximum, wherein the power spectral density of the radiation at the local minimum is less than 20% of the power spectral density of the radiation at the global maximum and the power spectral density of the radiation at the local maximum is at least 50% of the power spectral density of the radiation at the global maximum.

According to an aspect, there is provided a metrology apparatus for measuring a parameter of a lithographic process, comprising: an optical system configured to direct radiation from a radiation source onto a target formed on a substrate; and a beam modification device configured to modify radiation received from the radiation source and provide the modified radiation to the optical system, wherein: the beam modification device is configured to modify a wavelength spectrum of the radiation from the radiation source to have a local minimum between a global maximum and a local maximum, wherein the power spectral density of the radiation at the local minimum is less than 20% of the power spectral density of the radiation at the global maximum and the power spectral density of the radiation at the local maximum is at least 50% of the power spectral density of the radiation at the global maximum.

BRIEF DESCRIPTION OF THE DRAWINGS

Embodiments will now be described, by way of example only, with reference to the accompanying drawings in which.

DETAILED DESCRIPTION

Before describing embodiments of the invention in detail, it is instructive to present an example environment in which embodiments of the present invention may be implemented.

Figure 1:
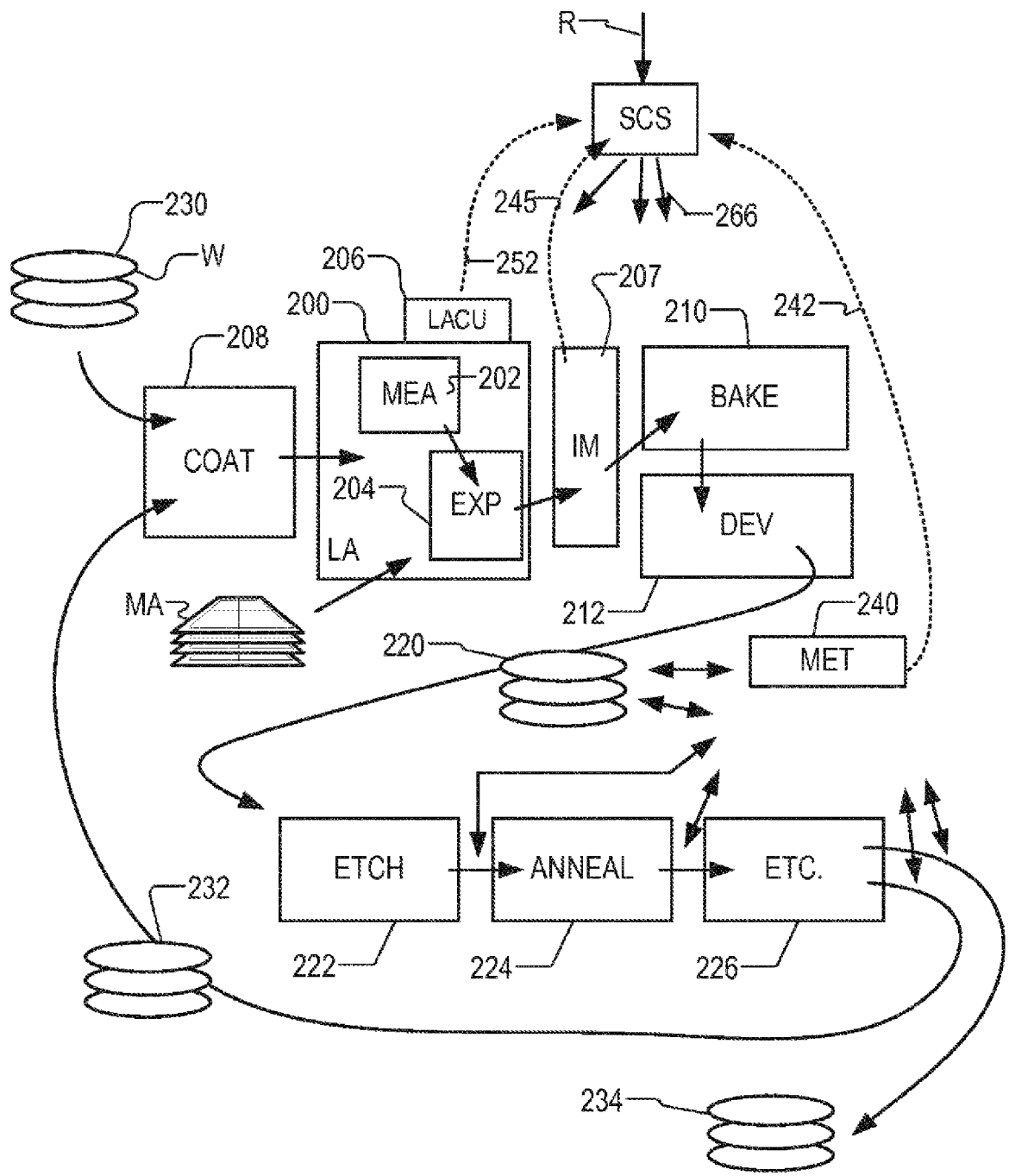
FIG. 1 depicts a lithographic apparatus together with other apparatuses forming a production facility for semiconductor devices.

FIG. 1 at 200 shows a lithographic apparatus LA as part of an industrial facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example be of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located may also include one or more metrology systems. The metrology systems may include a stand-alone metrology apparatus MET 240 and/or an integrated metrology apparatus IM 207. The stand-alone metrology apparatus MET 240 receives some or all of the substrates W that have been processed in the litho cell for performing measurements offline. The integrated metrology apparatus IM 207 performs inline measurements and is integrated into the track to receive and measure some or all of the substrates W immediately after exposure. Metrology results are provided directly or indirectly to the supervisory control system (SCS) 238. If errors are detected, adjustments may be made to exposures of subsequent substrates, especially if the metrology can be done soon and fast enough that other substrates of the same batch are still to be exposed.

A common example of a metrology apparatus in a modern lithographic production facility is a scatterometer, for example an angle-resolved scatterometer or a spectroscopic scatterometer, and it may normally be applied to measure properties of the developed substrates at 220 prior to etching in the apparatus 222. Using stand-alone metrology apparatus 240 and/or integrated metrology apparatus 207, it may be determined, for example, that important performance parameters such as overlay or critical dimension (CD) do not meet specified tolerances in the developed resist. Prior to the etching step, the opportunity exists to strip the developed resist and reprocess the substrates 220 through the litho cluster. As is also well known, the metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

Figure 2A:
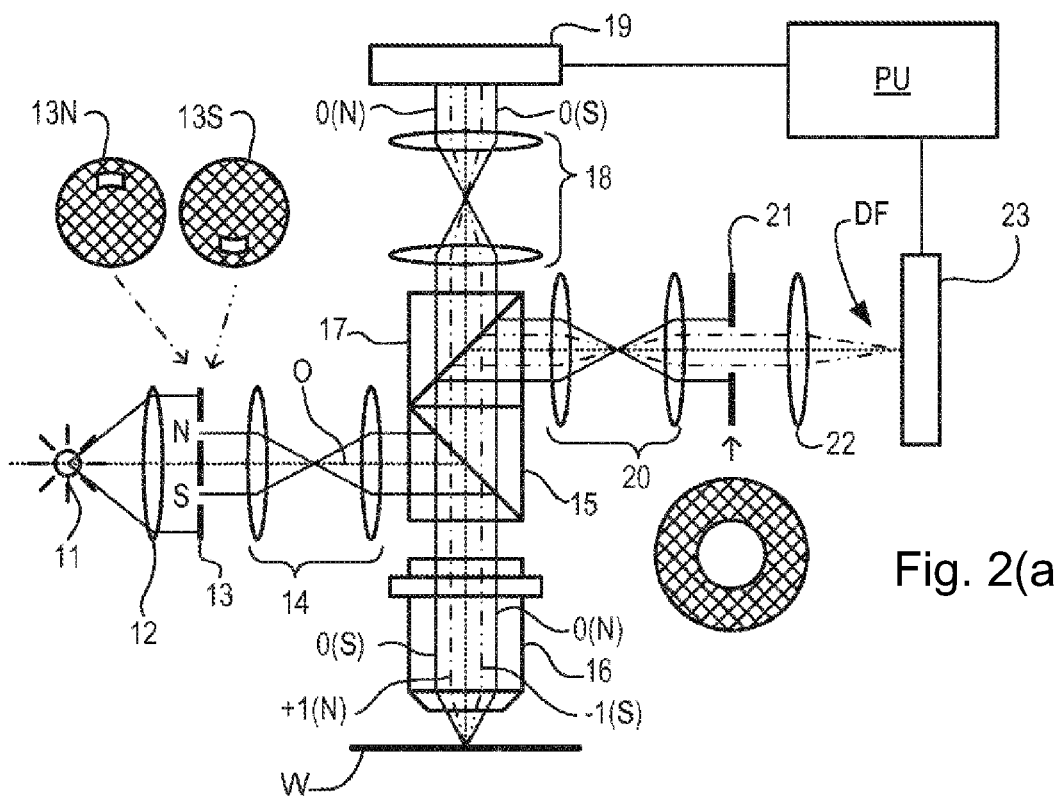
FIGS. 2(a)-2(b) comprise 2(a) a schematic diagram of a dark field scatterometer for use in measuring targets using a first pair of illumination apertures, 2(b) a detail of a diffraction spectrum of a target grating for a given direction of illumination.

A metrology apparatus is shown in FIG. 2(a). The stand-alone metrology apparatus 240 and/or the integrated metrology apparatus 207 may comprise such a metrology apparatus, for example, or any other suitable metrology apparatus. A target T and diffracted rays of measurement radiation used to illuminate the target are illustrated in more detail in FIG. 2(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access to an intermediate pupil-plane for spatial-frequency filtering. The angular range at which the radiation is incident on the substrate can be selected by defining a spatial intensity distribution in a plane that presents the spatial spectrum of the substrate plane, here referred to as a (conjugate) pupil plane. For example, this can be done by inserting an aperture plate 13 of suitable form between lenses 12 and 14, in a plane which is a back projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

Figure 2B:
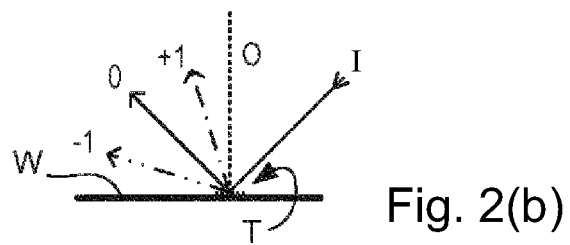

As shown in FIG. 2(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. Each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS.

2(*a*) and 2(*b*) are shown somewhat off axis, purely to enable them to be more easily distinguished in the diagram.

At least one of the orders diffracted or reflected by the target T on substrate W is collected by objective lens 16 and directed back through beam splitter 15. Returning to FIG. 2(*a*), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1 (S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 2 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 2) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented.

Metrology apparatuses may allow selection of the wavelength of the measurement radiation. The measurement radiation from the source 11 may be filtered such that a specific measurement can be performed. The wavelength may be adjusted once per full substrate measurement. The optimal wavelength may be layer dependent. Typically, the metrology apparatus comprises a small number, for example about 7 to 10, discrete filters to filter the measurement radiation, thereby enabling wavelength selection from only the same number of possible wavelengths. This can limit performance. Additionally, current switch time between discrete wavelengths is long and therefore can be adjusted only once per total substrate measurement.

Consequently, it has been proposed to replace the discrete filters with one or more linear variable filters (LVFs). An LVF is a filter having spectral properties which vary substantially linearly with position in one (or more) direction along the filter. By moving the filter relative to a radiation beam (either by physically moving the filter, beam or both) such that the position which the beam passes through the filter is varied, the filtered beam wavelength may be varied linearly across a wide range of wavelengths (for example, between 400 nm and 900 nm). The output radiation beam may be a beam of measurement radiation for use in a metrology apparatus such as that illustrated in FIG. 2(*a*).

The simplest implementation of LVFs is a single tunable band pass filter where the output wavelength is selected simply by the spatial position on the filter. In embodiments, the LVF may comprise such a single tunable band pass filter. A more flexible filter can be designed however by combining two edge-pass LVFs, one long wave pass LVF and one short wave pass LVF, to create a tunable pass band. By moving both filters together, the central wavelength can be continuously adjusted and by moving the filters relative to one another the bandwidth of the combined filter can also be tuned. Consequently, in other embodiments, the LVF may comprise both a short wave pass filter and a long wave pass filter in series, thereby providing a band pass filter which can be tuned continuously across a large band of center wavelengths (e.g., between 400 nm and 900 nm), and/or different pass bands.

In diffraction based overlay metrology, an asymmetry a in radiation diffracted from a target is used to determine overlay. The asymmetry a may be obtained for example based on a difference between components A and B extracted from the diffracted radiation, as follows:

$$a = \frac{A - B}{A + B}$$

The different components A and B may, for example, correspond to intensities from +1 and −1 diffracted orders of scattered radiation, as discussed above with reference to FIG. 2. Typically, the components A and B and resulting asymmetry a are acquired as images to allow different areas on the target to be compared with each other. For example, the target may comprise areas in which different pre-applied overlay biases β are applied. In an embodiment, asymmetries $a_+$ and $a_-$ are obtained respectively from areas having equal and opposite biases β. These can be combined to obtain a quantity b as follows:

$$b = \frac{a_+ + a_-}{a_+ - a_-}$$

Overlay can be derived from b with a reduced influence from non-overlay target asymmetries (e.g. sidewall angles of etched structures).

Figure 3:
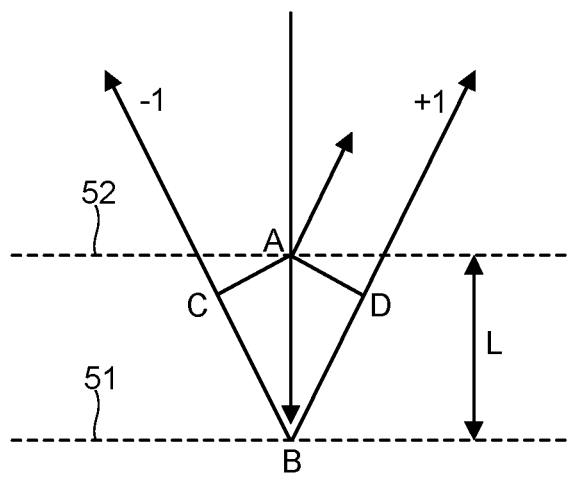
FIG. 3 schematically depicts a portion of a target having two layers and interference effects leading to a periodically varying sensitivity curve.

As depicted schematically in FIG. 3, interference effects occur between radiation (solid line arrows) reflected from different layers 51, 52 in the target (e.g. the layers between which overlay is being determined). The interference effects cause the asymmetry a to vary periodically as a function of the wavelength (which may be expressed via the wavenumber $\tilde{v}$, which is the inverse of the wavelength) of the incident radiation. In a simple case such as that depicted in FIG. 3, involving two layers 51, 52 separated by a distance L, the measured asymmetry a may take the following form as a function of wavenumber $\tilde{v}$ and overlay o:

$$a(\tilde{v}, o) = Ko \cos(2\pi \Delta L \tilde{v} + \varphi)$$

where K is a proportionality constant, $\varphi$ is a phase angle (which does not depend on the overlay o but does depend on other target properties, such as the materials of layers making up the target), and $\Delta L$ is the optical path length difference between radiation reflected from the upper layer 52 and radiation reflected from the lower layer 51 (e.g. the distance ABD in FIG. 3 for the example +1 diffracted ray, multiplied by the refractive index of the medium between the layers 51, 52). Thus, the strength of the overlay signal in the measured asymmetry a varies periodically as a function of wavenumber (or wavelength) via the quantity K cos($2\pi \Delta L \tilde{v} + \varphi$), which may therefore be referred to as a sensitivity S with respect to overlay.

Figure 4:
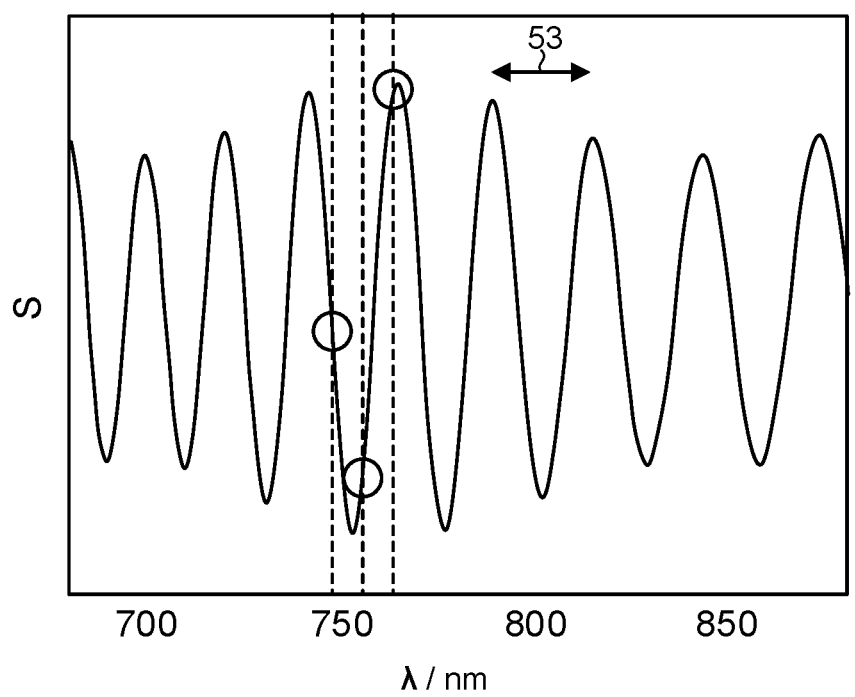
FIG. 4 is a graph showing a sensitivity curve and metrology measurements at three different wavelengths.

The sensitivity S will in general be a function of the target (e.g. geometry and materials) and of the measurement conditions (e.g. wavelength of radiation, polarization of radiation, angles of incidence of radiation). The variation of the sensitivity S with wavelength may be referred to as a sensitivity curve. The sensitivity curve may be plotted against wavelength or plotted against wavenumber (the inverse of wavelength). An example of a sensitivity curve plotted against wavelength is shown schematically in FIG. 4, described below. The frequency of oscillations of the sensitivity curve increases with the thickness of the stack. For some applications, such as 3D NAND applications, the distance between adjacent maxima can become smaller than 30 nm, which is comparable with the bandwidth of filters used in some metrology apparatuses.

Figure 5:
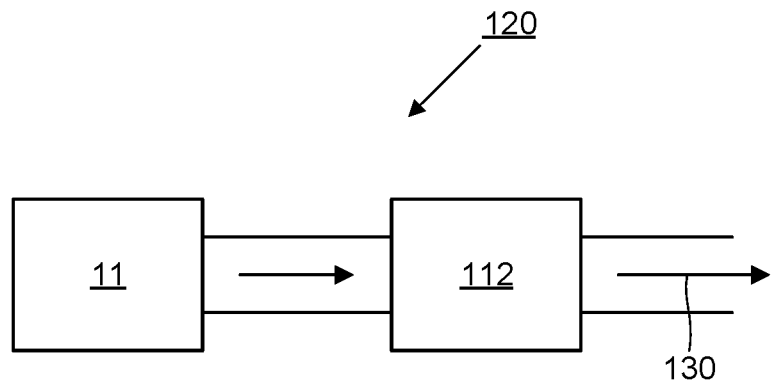
FIG. 5 schematically depicts an illumination system having a radiation source and a filter.

To achieve high sensitivity S and avoid cancellation of positive and negative sensitivities S within a given measurement of asymmetry a, narrower bandwidths of the incident radiation (e.g. narrower than 30 nm) may be produced and positioned near to a peak (a local minimum or a local maximum) in the sensitivity curve. This can be done using a tuned band pass filter such as the LVF described above. FIG. 5 depicts an illumination system 120 for achieving such functionality, comprising a radiation source 11 and a band pass filter 112. The band pass filter 112 filters broad-band radiation from the radiation source 11 to provide narrow-band output radiation 130. Using such a filter 112 to create a smaller bandwidth can resolve the issue of cancellation. However, the filtering reduces the amount of light available for the measurement, in proportion to the selected bandwidth. The reduction in the amount of light available for the measurement increases measurement time and decreases throughput.

The sensitivity curve may vary between different targets, for example due to unwanted variations in stack thickness across a substrate or between different substrates. A solution to this issue has been to measure sequentially at multiple wavelengths, using for example multiple respective settings of a band pass filter. A maximum signal or a weighted combination of the multiple signals may be used to suppress effects of the stack thickness variation and determine the parameter of interest reliably. An example of this approach is depicted for three wavelengths in FIG. 4, which shows schematically a typical sensitivity curve and positions of the three measurements (indicated by circles). The sensitivity S is here defined as the relative change in measurement signal that corresponds to a fixed change in the measured parameter of interest. Measurements of asymmetry a using the larger two wavelengths achieve relatively high sensitivity, whereas a measurement using the lowest of the three wavelengths would achieve relatively low sensitivity. A combination of the three measurements can thus be used to obtain high sensitivity (because two of the measurements have relatively high sensitivity even though one of the measurements does not). This approach is robust to variations in the phase and/or frequency of the sensitivity curve as long as the frequency of the sensitivity curve does not become so high that the three measurement wavelengths could simultaneously all be located near to zero sensitivity S. However, the need to make sequential measurements at different wavelengths requires additional measurement time and is detrimental to throughput.

Embodiments described below allow metrology measurements at multiple wavelengths to be performed more efficiently and thereby improve measurement speed and throughput, particularly where sensitivity curves vary rapidly as a function of wavelength.

Figure 6:
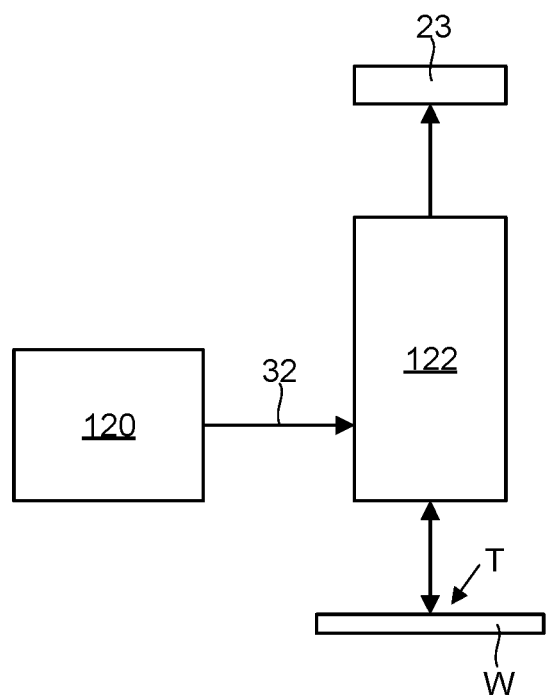
FIG. 6 schematically depicts a metrology apparatus for measuring a parameter of a lithographic process.

FIG. 6 schematically depicts a metrology apparatus suitable for implementing embodiments described below. The metrology apparatus is configured to measure a parameter of a lithographic process (e.g. a process as described above with reference to FIGS. 1 and 2). The metrology apparatus comprises an illumination system 120. An optical system 122 directs radiation (solid arrows) from the illumination system 120 onto a target T formed on a substrate W. In an embodiment, the target T comprises a multilayer structure and the parameter comprises an overlay error between different layers of the multilayer structure. The optical system 122 further directs radiation scattered from the target T to a detector 23. In an embodiment, the optical system 122 is implemented using one or more of the components of the metrology apparatus depicted in FIG. 2(a), including for example one or more of lenses 12, 14 and 16, aperture plate 13, beam splitter 15, first measurement branch (including one or more elements of optical system 18), and second measurement branch (including one or more elements of optical system 20, 22, and aperture stop 21). In an embodiment, the detector 23 is implemented as described above in relation to the second measurement branch and comprises a CCD or CMOS sensor. In an embodiment the optical system 122 is configured to form one or more images of the target T on the sensor 23.

Figure 7:
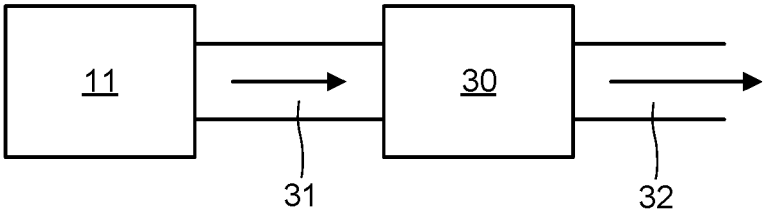
FIG. 7 schematically depicts an illumination system having a radiation source and a beam modification device.
Figure 8:
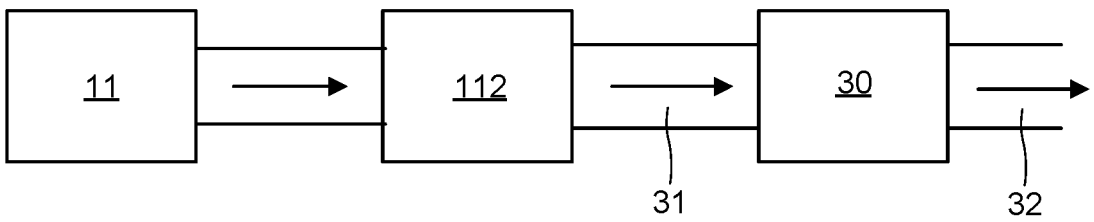
FIG. 8 schematically depicts an illumination system having a radiation source, a filter and a beam modification device.

The illumination system 120 comprises a radiation source 11 and a beam modification device 30 (see FIGS. 7 and 8). The beam modification device 30 modifies radiation from the radiation source 11 and provides the modified radiation 32 to the optical system 122. The beam modification device 30 modifies the wavelength spectrum of radiation from the radiation source 11 to have at least one local minimum and two local maxima (where one of the local maxima may also be a global maximum) simultaneously. The wavelength spectrum of radiation defines the amount of radiation (e.g. power or intensity) present as a function of wavelength. The distribution of power over the wavelength spectrum may be described by reference to the power spectral density, which describes how much power is present per wavelength interval. The at least one local minimum and two local maxima represent significant features in the wavelength spectrum rather than minor features such as ripples or noise. In an embodiment, the modified wavelength spectrum comprises a local minimum between a global maximum and a local maximum, wherein the power spectral density of the radiation at the local minimum is less than 20% (optionally less than 15%, optionally less than 10%, optionally less than 5%) of the power spectral density of the radiation at the global maximum and the power spectral density of the radiation at the local maximum is at least 50% (optionally at least 60%, optionally at least 70%, optionally at least 80%, optionally at least 90%) of the power spectral density of the radiation at the global maximum. By modifying the wavelength spectrum to simultaneously have at least two maxima in this way, the beam modification device 30 makes it possible to illuminate the target T simultaneously with two (or more, depending on the number of maxima provided) bands of radiation centered at different wavelengths. In contrast to the sequential approach of applying illumination at different wavelengths one after another, as described above with reference to FIG. 4, the beam modification device 30 makes it possible to apply multiple narrow-band illuminations simultaneously. This approach makes improved use of radiation provided by the radiation source 11 (by discarding a smaller proportion of the radiation) and also allows measurements to be performed in parallel. The sequence of three measurements at different wavelengths described above with reference to FIG. 4 can be performed in a single measurement for example (i.e. simultaneously). The beam modification device 30 thus supports improved measurement speed and throughput.

In an embodiment, as depicted in FIG. 7, the illumination system 120 is configured so that the beam modification device 30 receives broad-band radiation (e.g. without filtering from a broad-band radiation source 11) as an incoming radiation beam 31. In another embodiment, as depicted in FIG. 8, the illumination system 120 is configured so that the beam modification device 30 receives an incoming radiation beam 31 that has already been filtered by a filter 112, such as a band pass filter. In embodiments of the type depicted in FIG. 8, a bandwidth of the filter 112 may be larger than the bandwidth associated with individual minima or maxima introduced by the beam modification device 30 (as depicted for example in FIG. 10 described below).

Figure 9:
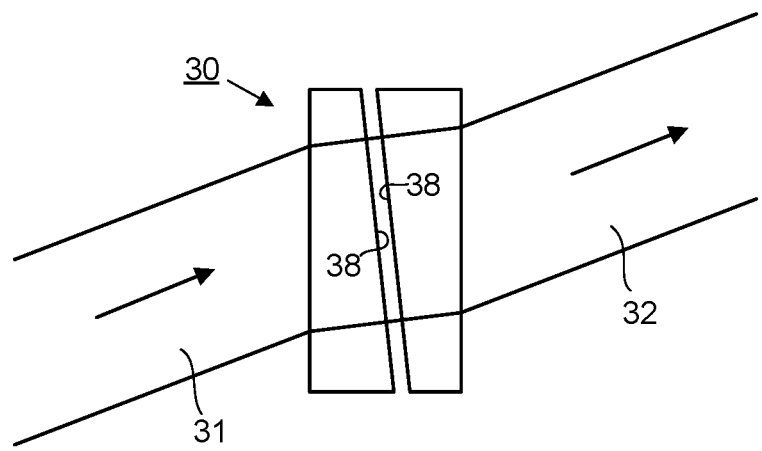
FIG. 9 schematically depicts a tunable multi-band filter comprising a Fabry-Pérot interferometer.
Figure 10:
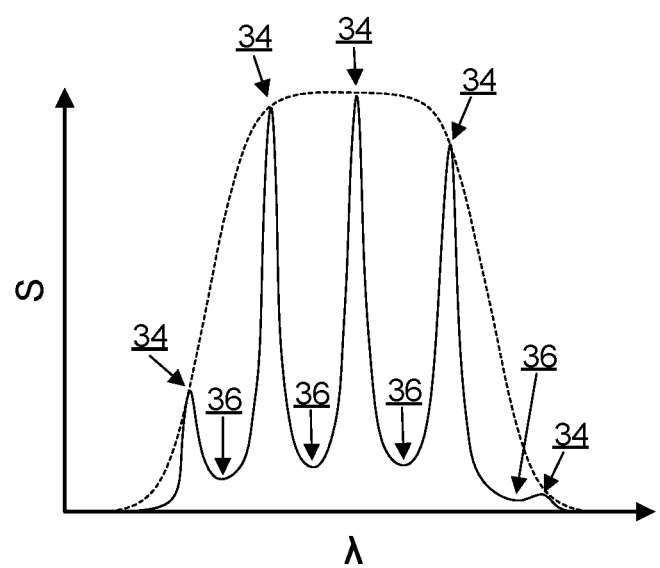
FIG. 10 is a graph showing an example modified wavelength spectrum output from a beam modification device.

In an embodiment, the beam modification device 30 comprises a tunable multi-band filter that modifies the wavelength spectrum using interferometry principles, for example by arranging for interferometric resonances to create the required maxima and minima. In an example of such an embodiment, as depicted schematically in FIG. 9, the beam modification device 30 comprises a Fabry-Pérot interferometer (i.e. an interferometer configured to operate based on the principles of the Fabry-Pérot interferometer). The Fabry-Pérot interferometer filters input radiation in such a way as to produce a comb-like wavelength spectrum, with regularly spaced local maxima 34 and local minima 36. In conformity with the principles of the Fabry-Pérot interferometer, the Fabry-Pérot interferometer comprises two parallel, partially reflective surfaces 38. The transmission wavelength spectrum comprises peaks (local maxima 34) corresponding to resonances of the space between the partially reflective surfaces 38. An example of an output radiation beam 32 from the beam modification device 30 of FIG. 9 is depicted in FIG. 10. The illumination system 120 in this embodiment is configured as shown in FIG. 8. An incoming radiation beam 31 to the Fabry-Pérot interferometer of FIG. 9 was band-pass filtered by filter 112 so as to have a wavelength spectrum of the form indicated by the broken line envelope in FIG. 10. The subsequent filtering by the Fabry-Pérot interferometer causes an outgoing radiation beam 32 to have a comb-like wavelength spectrum superimposed on the broader band wavelength spectrum of the incoming radiation beam 31. In the particular example depicted in FIG. 10 the beam modification device 30 thus modifies the wavelength spectrum of radiation from the radiation source 11 in such a way as to have five local maxima 34 (one of which is the global maximum) and four local minima 36.

The spacing $\Delta\tilde{v}_c$ (in wavenumber space) between the local maxima 34 provided by the Fabry-Pérot interferometer is given by the following expression:

$$\Delta\tilde{v}_c = \frac{1}{2h}$$

where h is the distance between the partially reflective surfaces 38.

In an embodiment, the modified wavelength spectrum is such as to more closely match or follow a sensitivity curve than if the wavelength spectrum were not modified. Matching the wavelength spectrum to the sensitivity curve in this way improves overall sensitivity, thereby improving accuracy and/or allowing measurements to be performed more quickly and/or using simpler apparatus. In an embodiment, a local maximum 34 and the global maximum 34 on either side and directly adjacent to a local minimum, and/or at least two other of the local maxima 34, are matched to positions of local maxima or local minima (e.g. with all of the maxima concerned, in the modified wavelength spectrum, lined up with local maxima in the sensitivity curve or lined up with local minima in the sensitivity curve) plotted against wavenumber to within 25%, optionally within 15%, optionally within 10%, optionally within 5%, optionally within 1%, of an average separation between local maxima, or of an average separation between local minima, in the sensitivity curve plotted against wavenumber. The sensitivity curve may be derived by performing calibration measurements (e.g. by performing measurements at multiple wavelengths and calculating the sensitivity at each wavelength) and/or by mathematical modelling.

In an embodiment, the wavelength spectrum is modified so that two or more pairs of adjacent local maxima 34 (optionally including the global maximum) or adjacent local minima 36 are evenly spaced when the wavelength spectrum is plotted against wavenumber (e.g. such that the wavelength spectrum is at least locally periodic or pseudo-periodic). In such an embodiment, a separation between the evenly spaced maxima (i.e. a period or unit cell of the wavelength spectrum plotted against wavenumber) is tuned to match an average separation (averaged over the spectral range of the wavelength spectrum) between local maxima in the sensitivity curve plotted against wavenumber, or between local minima in the sensitivity curve plotted against wavenumber, to within 25%, optionally with 15%, optionally within 10%, optionally within 5%, optionally within 1%, of the average separation between local maxima in the sensitivity curve. In embodiments where a Fabry-Pérot interferometer is used as described above with reference to FIG. 9, such matching may be achieved by tuning the Fabry-Pérot interferometer such that $h=\Delta L/2$. Matching the periods in this way will result in higher sensitivity to overlay at a path length difference of $\Delta L$, except if the phase is approximately $\varphi \approx \pi/2$. In an embodiment, the Fabry-Pérot interferometer is implemented using electrostatic actuation to tune the positions of reflective membranes providing the partially reflective surfaces 38. Configuring the Fabry-Pérot interferometer to be tunable so that h can be varied in a range between 0 and about 50 microns, optionally between 0 and about 10 microns, will cover a wide range of likely applications. In applications where the sensitivity curve is more complex and/or where the effects of multiple different parameters (e.g. different overlay parameters) need to be suppressed, more complex modification of the wavelength spectrum may be necessary, including modification in which there is a less direct correlation between the desired positions of maxima or minima in the modified wavelength spectrum and positions of maxima or minima in the sensitivity curve.

In an embodiment, the phase of a periodic variation in the modified wavelength spectrum plotted against wavenumber corresponding to the evenly spaced local maxima or evenly spaced local minima is tuned to be in phase with the sensitivity curve plotted against wavenumber (e.g. with local maxima or local minima respectively aligned along a horizontal axis representing wavenumber) to within 25%, optionally within 15%, optionally within 10%, optionally within 5%, optionally within 1%, of the average separation between local maxima in the sensitivity curve plotted against wavenumber (e.g. such that local maxima in the periodic variation applied by the beam modification device 30 occur close to or at the same wavelength or wavenumber as maxima in the sensitivity curve or minima in the sensitivity curve). This is illustrated schematically in FIG. 11. The short-segment broken line curve depicts an expected sensitivity curve plotted against wavelength (the plot against wavenumber would look similar but with more regularly spaced peaks) in arbitrary units along the vertical axis. The long-segment broken line curve depicts in arbitrary units along the vertical axis a periodically varying wavelength spectrum created by the beam modification device 30 (which follows the form of the curve in FIG. 10) with period and phase tuned so that local maxima in the periodically varying wavelength spectrum correspond to local maxima in the sensitivity curve and local minima in the periodically varying wavelength spectrum correspond to local minima in the sensitivity curve. The solid line curve shows in arbitrary units along the vertical axis the product of the periodically varying wavelength spectrum and the sensitivity curve, which correlates with an overall sensitivity of the process to the parameter of interest and remains predominantly positive over the wavelength range considered. In an alternative arrangement, the local maxima in the modified wavelength spectrum could be aligned with local minima in the sensitivity curve, in which case the solid line curve would be predominantly negative and analogous benefits in terms of improved sensitivity would be obtained.

Figure 11:
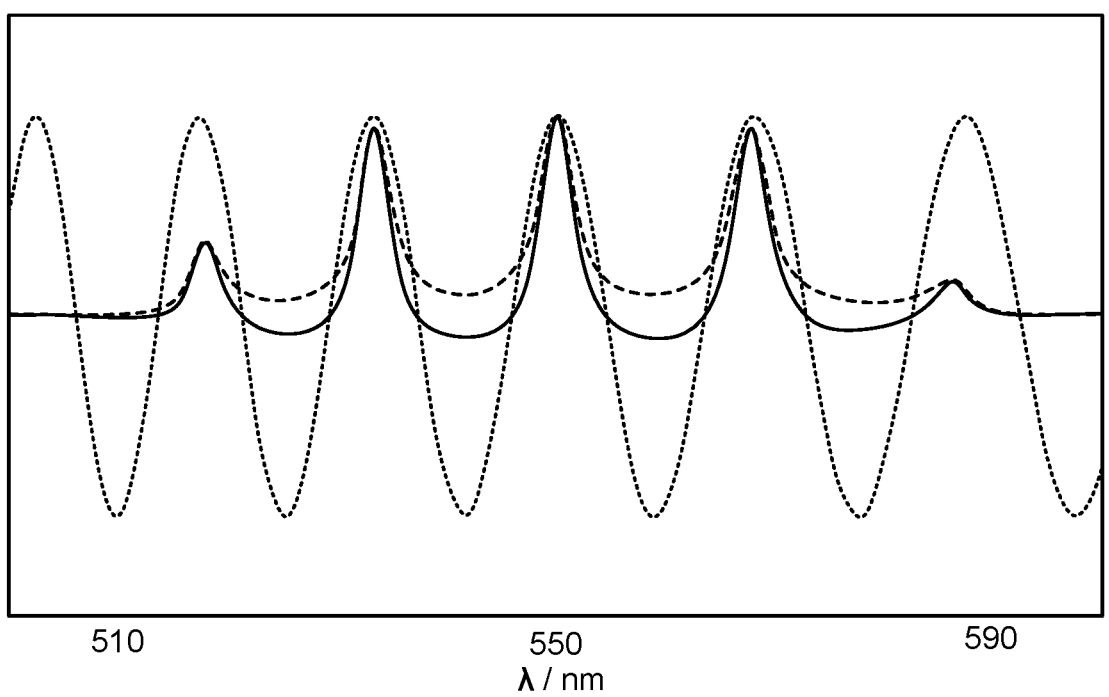
FIG. 11 is a graph showing a product of a modified wavelength spectrum of the type depicted in FIG. 10 and a sensitivity curve.

The integral under the solid curve in FIG. 11 equals approximately ⅙ of the bandwidth of the filter 112 (corresponding to the broken line curve in FIG. 10) times the maximum of the sensitivity curve. Since the approach allows a much broader setting of the filter 112 without loss of signal due to cancellation, the bandwidth of the filter 112 can be set higher (e.g. higher than 6 times the width of a single peak in the sensitivity curve), thus supporting decreased measurement time and improved throughput.

In embodiments using the Fabry-Pérot interferometer, the phase may be adjusted such that maxima j will occur at wavenumbers $$\tilde{v}_j = (j+f)\Delta\tilde{v}_c$$

where j is an integer and f is a number between 0 and 1. This may be achieved, for example, using an appropriate multilayer coating to implement the partially reflective surfaces 38 which results in nonzero f. For example, if a particular overlay parameter is associated with a sensitivity curve defined by φ=π/2, overall sensitivity could be enhanced by using partially reflective surfaces with f=0.25. In this particular case, coatings could be applied to implement the partially reflective surfaces 38 that have a λ/8 phase shift on each reflection over the full range of wavelengths. In an embodiment, a chirped dielectric mirror is used for this purpose.

In an alternative embodiment, the beam modification device 30 modifies the wavelength spectrum of the radiation using an acousto-optic tunable filter. Such filters, which may also be referred to as Bragg cells, use the acousto-optic effect to diffract radiation passing through them using sound waves. By controlling the frequency of the applied sound waves it is possible to provide a periodic output wavelength spectrum (similar to that described above with reference to the Fabry-Pérot interferometer) with tunable period and tunable phase.

In an embodiment, the methodology is repeated to obtain the parameter of the lithographic process multiple times using either or both of different targets and different substrates, and the spectrum is modified differently in order to be matched to a different respective sensitivity curve for each of at least a subset of the multiple measurements. The methodology can thus maintain high overall sensitivity by following changes in the sensitivity curve as processes change between different substrates or at different locations over a substrate.

Figure 12:
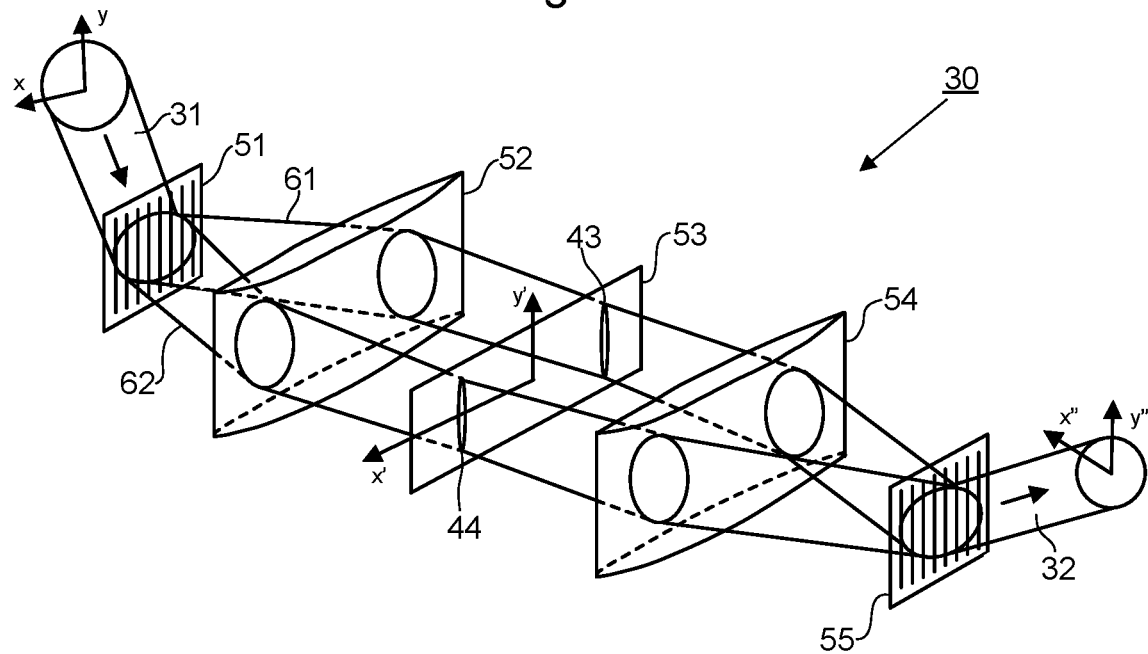
FIG. 12 schematically depicts a beam modification device comprising a spatial light modulator (SLM) configured to modify a wavelength spectrum of radiation to vary as a function of angle of incidence onto a substrate.
Figure 13:
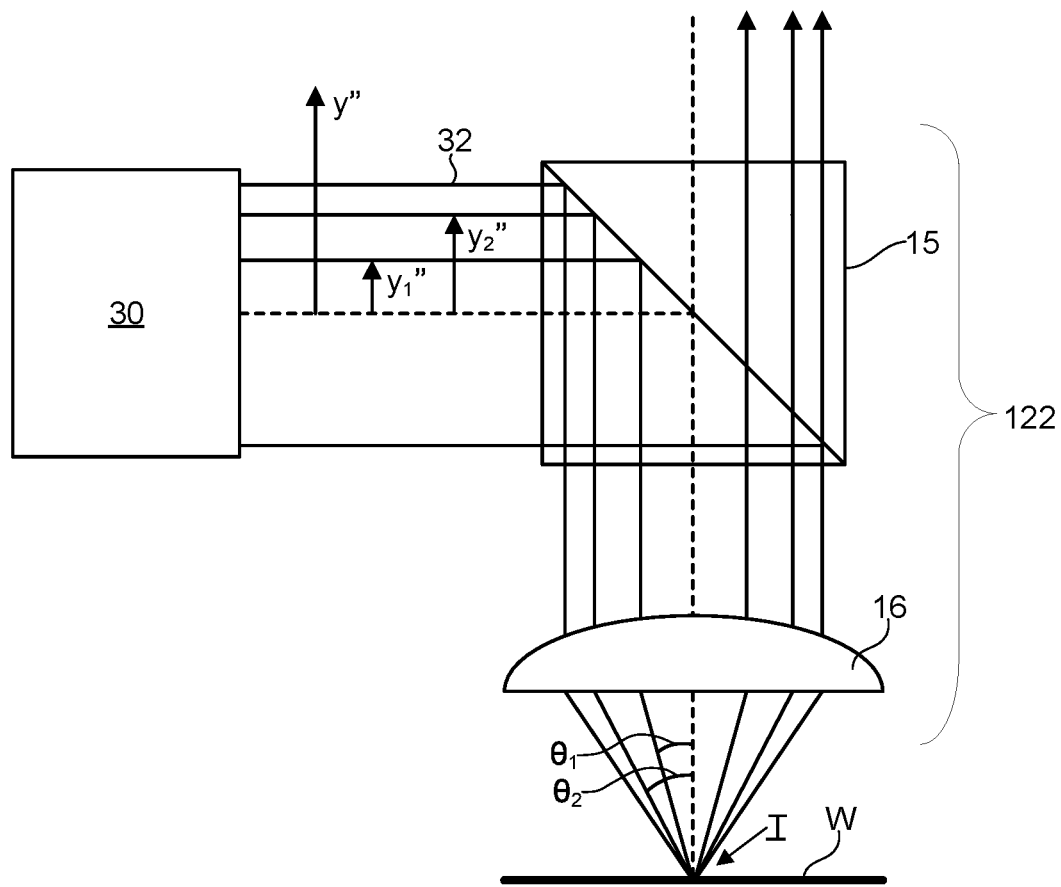
FIG. 13 schematically depicts example rays produced by the beam modification device of FIG. 12 directed onto the target at different angles of incidence.

In a further alternative approach, as depicted in FIGS. 12 and 13, the beam modification device 30 operates by directing (e.g. using an appropriate optical element such as a prism or grating) different wavelength components of radiation to be modified to different locations and modulated the radiation differently in at least a subset of the different respective locations to perform the modification of the wavelength spectrum. In an embodiment, the different locations correspond to different respective regions of a spatial light modulator (which may also be referred to as an SLM) 53. In such an embodiment, the SLM 53 then modulates radiation differently in at least a subset of the different respective regions to perform the modification of the wavelength spectrum. Thus, to produce a wavelength spectrum as depicted in FIG. 10, for example, the SLM 53 may be programmed to pass radiation in regions of the SLM 53 that receive wavelength components corresponding to the maxima 34 and be programmed to remove radiation in regions of the SLM 53 that receive wavelength components corresponding to the minima 36. The SLM 53 can define both the period and the phase of the wavelength spectrum. The SLM 53 may be implemented in various ways. In an embodiment, the SLM 53 is configured to modify a polarization of radiation passing through the SLM 53 and cooperate with a polarizer to selectively pass or block radiation from different regions of the SLM 53. In an embodiment, the SLM 53 comprises a liquid crystal (LC) mask, a ferroelectric mask, or an array of tiltable mirrors. In an embodiment, the SLM 53 comprises a hard mask (e.g. a lightweight sheet of metal with apertures) that can be switched mechanically more rapidly than a heavier glass-substrate filter.

FIG. 12 shows an example beam modification device 30 of this type. The beam modification device 30 comprises a first grating 51, a first cylindrical lens 52, an SLM 53, a second cylindrical lens 54, and a second grating 55. Rays in an incoming radiation beam 31 to the beam modification device 30 can be characterized by their x, y coordinates. The incoming radiation beam 31 is diffracted by the first grating 51. In the embodiment shown, the first grating 51 and second grating 55 are transmissive but equivalent configurations could be conceived using reflective gratings without departing from the underlying principle. Each wavelength component in the incoming radiation beam 31 is diffracted into a different direction. A representative long wavelength component is labelled 61 and a representative short wavelength component is labelled 62, but a continuous range of wavelength components may be present in practice. The diffracted wavelength components are focused into line foci 43, 44 by the first cylindrical lens 52 on the SLM 53. The long wavelength component 61 is focused to line focus 43 on the SLM 53. The short wavelength component 62 is focused to line focus 44 on the SLM 53. The SLM 53 can change the properties of the transmitted light as a function of the x', y' coordinates on the SLM 53. In the configuration of the beam modification device 30 shown, the x' coordinate is related to wavelength (due to the wavelength-dependent diffractive spreading provided by the first grating 51 having a periodicity parallel to the x' direction, with grating lines extending parallel to the y' direction) and the y' coordinate matches the y coordinate in the incident radiation beam 31. In an embodiment, a property of the transmitting radiation changed by the SLM 53 is polarization. Thus, in combination with a polarizer (which can be immediately downstream from the SLM 53 or elsewhere downstream), the SLM 53 can operate effectively as a position-dependent attenuator. The SLM 53 can thus attenuate radiation as a function of x', y' or equivalently, $\lambda$, y', thereby providing the selective passing or removal of radiation mentioned above. Radiation output from the SLM 53 passes through the second cylindrical lens 54 and the second grating 55, which combine the wavelength components into a single collimated outgoing radiation beam 32 with ray coordinates x" and y". If the incoming radiation beam 31 has an irradiance profile I(x,y, $\lambda$), where $\lambda$ is the wavelength, then the irradiance profile of the outgoing radiation beam 32 is given by the following expression:

$$I'(x'',y'', \lambda)=I(x'', y'', \lambda) \, T(y', \lambda),$$

where T (y', $\lambda$) is a transfer function that can be chosen freely (although normally such that 0<T<1). Similar functionality could be achieved by folding the configuration of FIG. 12 so as to have only a single lens and a single grating. Alternatively, the configuration could be adapted so that radiation reflects two or four times from a grating. In the configuration shown in FIG. 12, the distances 51-52, 52-53, 53-54, and 54-55 are all equal to the focal lengths of the cylindrical lenses 52 and 54.

Embodiments of the type depicted in FIG. 12 allow flexible and efficient modification of the wavelength spectrum of radiation for a given angle of incidence of the radiation onto the target T. The geometry additionally allows the wavelength spectrum to be modified to vary as a function of the angle of incidence. This is desirable because the sensitivity curve will also vary as function of angle of incidence (e.g. changing frequency and/or phase as a function of angle of incidence) for many applications. In an embodiment, improved overall measurement sensitivity is achieved by causing the variation of the wavelength spectrum as a function of angle of incidence to follow more closely an expected variation of the sensitivity curve as a function of angle of incidence (e.g. by matching the period and/or phase), relative to if a constant wavelength spectrum were applied for all angles of incidence.

FIGS. 12 and 13 show how the modification of the wavelength spectrum as a function of angle of incidence may be achieved using an SLM 53. In embodiments of this type, the modification is applied by the SLM 53 modulating radiation differently in portions of the SLM 53 contributing to different respective angles of incidence of radiation onto the target T. In the geometry shown, these different portions of the SLM 53 correspond to different positions along the y' direction. Different positions along the y' direction correspond to different positions along the y" direction in the outgoing radiation beam 32. Since the wavelength spectrum can be made dependent on the y" coordinate, it will also be dependent on the angle of incidence $\theta$ on the target. This is illustrated in FIG. 13, which shows interaction between the beam modification device 30 and selected elements of the optical system 122 (a beam splitter 15 and an objective lens 16). Example rays of the outgoing radiation beam 32 are shown at y" coordinates $y_1$" and $y_2$". An optical axis is indicated by the broken line. The rays are redirected by beam splitter 15 and then focused onto the target T. Scattered radiation passes through the objective lens 16 and beam splitter 15 to a detector (not shown). The angle of incidence depends on the y" coordinate: the ray from $y_1$" is incident at $\theta_1$ and the ray from $y_2$" is incident at $\theta_2$.

The arrangement shown in FIGS. 12 and 13 is an example of where an optical element (the first grating 51) spreads different wavelength components across the SLM 53 exclusively parallel to a first axis (parallel to the x' direction), such that each elongate region (strip) of the SLM 53 orthogonal to the first axis receives a different wavelength component. The optical system 122 is configured such that radiation received by the SLM 53 at different positions along a second axis (parallel to the y' direction) of the SLM 53 contributes to different respective angles of incidence onto the target T. The modulation of radiation differently in portions of the SLM 53 contributing to different respective angles of incidence of radiation onto the target T comprises modulating radiation non-uniformly as a function of position along the second axis. In the example shown, the first axis is orthogonal to the second axis, but other arrangements are possible. The first axis could, for example, be orientated at an oblique angle relative to the second axis.

A wavelength spectrum applied at a given angle of incidence can thus be defined by appropriate actuation of an elongate region (strip) of the SLM 53 that is parallel to x' and passes through the y' coordinate corresponding to the given angle of incidence. By actuating corresponding strips passing through different y' coordinates it is possible to apply different spectra to radiation incidence on the target at different angles of incidence. Matching the spectra to expected variations of the sensitivity curve at the different angles of incidence achieves improved overall sensitivity.

Embodiments of the disclosure can be applied where it is desired to obtain multiple overlay parameters (e.g. respectively representing shifts between different combinations of layers in the target). In this case, different sensitivity curves may be expected for different overlay parameters and multiple measurements could be made with the wavelength spectrum of radiation modified independently each time so as to be optimal for the particular overlay parameter being obtained and/or to reduce sensitivity to other layer pairs and/or nuisance asymmetry properties (e.g. sidewall angles). For example, where it is desired to obtain N overlay parameters from a target, one may perform M (e.g. M=1/2N(N+1)) measurements with differently modified spectra. In such embodiments, the analysis could be done based on the asymmetry a without pre-applied bias, such that overlay parameters $o_{1j}$ between a reference layer 1 and other layers j could be obtained from the following:

$$o_{1i} = \sum_{j=1}^{M} Q_{ij} a_j$$

where Q is a sparse N×M matrix.

In embodiments where the beam modification device uses a tunable multiband filter based on the Fabry-Pérot interferometer principle, such as depicted in FIG. 9, the partially reflective surfaces 38 may be configured (e.g. via appropriate selection of coatings) to maximize fundamental Fourier transform components of the transmittance wavelength spectrum $T(\tilde{v})$, e.g., to maximize the following:

$$\int_0^{\Delta \tilde{v}_c} \cos\left(\frac{2\pi \tilde{v}}{\Delta \tilde{v}_c}\right) T(\tilde{v}) d\tilde{v}$$

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further embodiments according to the invention are presented in below numbered clauses:

1. A method of measuring a parameter of a lithographic process, comprising:
    modifying radiation from a radiation source and illuminating with the modified radiation a target formed on a substrate using the lithographic process; and
    detecting radiation scattered from the target and analyzing the detected radiation to determine the parameter, wherein:
    the modification of the radiation comprises modifying a wavelength spectrum of the radiation to have a local minimum between a global maximum and a local maximum, wherein the power spectral density of the radiation at the local minimum is less than 20% of the power spectral density of the radiation at the global maximum and the power spectral density of the radiation at the local maximum is at least 50% of the power spectral density of the radiation at the global maximum.
2. The method of clause 1, wherein:
    a sensitivity curve defines a variation of a sensitivity of the process of determining the parameter as a function of the wavelength of radiation scattered from the target; and
    the modified wavelength spectrum more closely matches the sensitivity curve relative to if the wavelength spectrum were not modified, such that an overall sensitivity of the process of determining the parameter by analyzing the detected radiation is improved.
3. The method of clause 2, wherein positions of the local maximum and the global maximum, or at least two other local maxima of the modified wavelength spectrum, are matched to positions of local minima or local maxima in the sensitivity curve plotted against wavenumber to within 25% of an average separation between local maxima, or of an average separation between local minima, in the sensitivity curve plotted against wavenumber.
4. The method of clause 2 or 3, wherein the wavelength spectrum is modified so that two or more pairs of adjacent local maxima are evenly spaced when the wavelength spectrum is plotted against wavenumber.
5. The method of clause 4, wherein a separation between the evenly spaced local maxima is tuned to match a separation between local maxima or between local minima in the sensitivity curve plotted against wavenumber, to within 25% of an average separation between local maxima, or of an average separation between local minima, in the sensitivity curve plotted against wavenumber.
6. The method of clause 5, wherein a phase of a periodic variation in the modified wavelength spectrum plotted against wavenumber corresponding to the evenly spaced local maxima is tuned to be in phase with the sensitivity curve plotted against wavenumber to within 25% of the average separation between local maxima, or of the average separation between local minima, in the sensitivity curve plotted against wavenumber.
7. The method of any of clauses 2-6, wherein the parameter of the lithographic process is measured multiple times using either or both of different targets and different substrates, and the spectrum is modified differently in order to be matched to a different respective sensitivity curve for each of at least a subset of the measurements of the parameter of the lithographic process.
8. The method of any preceding clause, wherein the wavelength spectrum is modified using a tunable multi-band filter based on interferometry.
9. The method of clause 8, wherein the tunable multi-band filter comprises a Fabry-Pérot interferometer.
10. The method of any preceding clause, wherein the wavelength spectrum is modified using an acousto-optic tunable filter.
11. The method of any preceding clause, wherein:
    different wavelength components of radiation to be modified are directed to different respective locations; and
    the radiation is modulated differently in at least a subset of the different respective locations to perform the modification of the wavelength spectrum.
12. The method of any preceding clause, wherein:
    different wavelength components of radiation to be modified are directed to different respective regions of a spatial light modulator; and
    the spatial light modulator modulates radiation differently in at least a subset of the different respective regions to perform the modification of the wavelength spectrum.
13. The method of any preceding clause, wherein the modification of the radiation further comprises modifying the wavelength spectrum to vary as a function of angle of incidence of the radiation onto the target.
14. The method of clause 13, wherein:
    a sensitivity curve defines a variation of a sensitivity of the process of determining the parameter as a function of the wavelength of radiation scattered from the target; and
    the variation of the wavelength spectrum as a function of angle of incidence more closely matches a variation of the sensitivity curve as a function of angle of incidence relative to if a constant wavelength spectrum were applied for all angles of incidence, such that an overall sensitivity of the process of determining the parameter by analyzing the detected radiation is improved.

15. The method of clause 14, wherein the variation of the wavelength spectrum as a function of angle of incidence is applied using a spatial light modulator.

16. The method of clause 15, wherein the spatial light modulator modulates radiation differently in portions of the spatial light modulator contributing to different respective angles of incidence.

17. The method of any preceding clause, wherein the target comprises a multilayer structure and the parameter comprises an overlay error between different layers of the multilayer structure.

18. A metrology apparatus for measuring a parameter of a lithographic process, comprising:
    an optical system configured to direct radiation from a radiation source onto a target formed on a substrate; and
    a beam modification device configured to modify radiation received from the radiation source and provide the modified radiation to the optical system, wherein:
        the beam modification device is configured to modify a wavelength spectrum of the radiation from the radiation source to have a local minimum between a global maximum and a local maximum, wherein the power spectral density of the radiation at the local minimum is less than 20% of the power spectral density of the radiation at the global maximum and the power spectral density of the radiation at the local maximum is at least 50% of the power spectral density of the radiation at the global maximum.

19. The apparatus of clause 18, wherein the beam modification device is further configured to modify the wavelength spectrum to vary as a function of angle of incidence of the radiation onto the target.

20. The apparatus of any of clauses 18-19, wherein the beam modification device comprises one or more of the following: a tunable multi-band filter; a Fabry-Pérot interferometer; an acousto-optic tunable filter.

21. The apparatus of any of clauses 18-20, wherein the beam modification device comprises:
    an optical element; and
    a spatial light modulator, wherein:
        the optical element is configured to direct different wavelength components of radiation to be modified onto different respective regions of the spatial light modulator; and
        the spatial light modulator is configured to modulate the radiation differently in at least a subset of the different respective regions to thereby modify the wavelength spectrum.

22. The apparatus of clause 21, wherein the spatial light modulator is further configured to modulate radiation differently in portions of the spatial light modulator contributing to different respective angles of incidence of radiation onto the target.

23. The apparatus of clause 22, wherein:
    the optical element is configured to spread different wavelength components across the spatial light modulator exclusively parallel to a first axis, such that each elongate region of the spatial light modulator orthogonal to the first axis receives a different wavelength component; and
    the optical system is configured such that radiation received by the spatial light modulator at different positions along a second axis of the spatial light modulator contributes to different respective angles of incidence onto the target; and
    the modulation of radiation differently in portions of the spatial light modulator contributing to different respective angles of incidence of radiation onto the target comprises modulating radiation non-uniformly as a function of position along the second axis.

24. The apparatus of clause 23, wherein the first axis is orthogonal to the second axis.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to anyone or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring a parameter of a lithographic process, comprising:
    modifying radiation from a radiation source;
    illuminating a target formed on a substrate with the modified radiation using the lithographic process;
    detecting radiation scattered from the target; and
    analyzing the detected radiation to determine the parameter,
    wherein the modification of the radiation comprises modifying a wavelength spectrum of the radiation to have a local minimum between a global maximum and a local maximum,
    wherein the power spectral density of the radiation at the local minimum is less than 20% of the power spectral density of the radiation at the global maximum, and
    wherein the power spectral density of the radiation at the local maximum is at least 50% of the power spectral density of the radiation at the global maximum.

2. The method of claim 1, wherein:
    a sensitivity curve defines a variation of a sensitivity of the process of determining the parameter as a function of the wavelength of radiation scattered from the target; and
    the modified wavelength spectrum more closely matches the sensitivity curve relative to if the wavelength spectrum was not modified, such that an overall sensitivity of the process of determining the parameter by analyzing the detected radiation is improved.

3. The method of claim 2, wherein positions of the local maximum and the global maximum, or at least two other local maxima of the modified wavelength spectrum, are matched to positions of local minima or local maxima in the sensitivity curve plotted against wavenumber to within 25% of an average separation between local maxima, or of an average separation between local minima, in the sensitivity curve plotted against wavenumber.

4. The method of claim 2, wherein the wavelength spectrum is modified so that two or more pairs of adjacent local maxima are evenly spaced when the wavelength spectrum is plotted against wavenumber.

5. The method of claim 4, wherein a separation between the evenly spaced local maxima is tuned to match a separation between local maxima or between local minima in the sensitivity curve plotted against wavenumber, to within 25% of an average separation between local maxima, or of an average separation between local minima, in the sensitivity curve plotted against wavenumber.

6. The method of claim 5, wherein a phase of a periodic variation in the modified wavelength spectrum plotted against wavenumber corresponding to the evenly spaced local maxima is tuned to be in phase with the sensitivity curve plotted against wavenumber to within 25% of the average separation between local maxima, or of the average separation between local minima, in the sensitivity curve plotted against wavenumber.

7. The method of claim 2, wherein:
the parameter of the lithographic process is measured multiple times using either or both of different targets and different substrates, and
the spectrum is modified differently in order to be matched to a different respective sensitivity curve for each of at least a subset of the measurements of the parameter of the lithographic process.

8. The method of claim 1, wherein the wavelength spectrum is modified using a tunable multi-band filter based on interferometry.

9. The method of claim 8, wherein the tunable multi-band filter comprises a Fabry-Pérot interferometer.

10. The method of claim 1, wherein the wavelength spectrum is modified using an acousto-optic tunable filter.

11. The method of claim 1, wherein:
different wavelength components of radiation to be modified are directed to different respective locations; and
the radiation is modulated differently in at least a subset of the different respective locations to perform the modification of the wavelength spectrum.

12. The method of claim 1, wherein:
different wavelength components of radiation to be modified are directed to different respective regions of a spatial light modulator; and
the spatial light modulator modulates radiation differently in at least a subset of the different respective regions to perform the modification of the wavelength spectrum.

13. The method of claim 1, wherein the modification of the radiation further comprises modifying the wavelength spectrum to vary as a function of angle of incidence of the radiation onto the target.

14. A metrology apparatus for measuring a parameter of a lithographic process, comprising:
an optical system configured to direct radiation from a radiation source onto a target formed on a substrate; and
a beam modification device configured to modify radiation received from the radiation source and provide the modified radiation to the optical system,
wherein the beam modification device is configured to modify a wavelength spectrum of the radiation from the radiation source to have a local minimum between a global maximum and a local maximum,
wherein the power spectral density of the radiation at the local minimum is less than 20% of the power spectral density of the radiation at the global maximum, and
wherein the power spectral density of the radiation at the local maximum is at least 50% of the power spectral density of the radiation at the global maximum.

15. The apparatus of claim 14, wherein the beam modification device is further configured to modify the wavelength spectrum to vary as a function of angle of incidence of the radiation onto the target.

16. The apparatus claim 14, wherein the beam modification device comprises one or more of the following: a tunable multi-band filter; a Fabry-Pérot interferometer; or an acousto-optic tunable filter.

17. The apparatus of claim 14, wherein the beam modification device comprises:
an optical element; and
a spatial light modulator,
wherein the optical element is configured to direct different wavelength components of radiation to be modified onto different respective regions of the spatial light modulator; and
wherein the spatial light modulator is configured to modulate the radiation differently in at least a subset of the different respective regions to thereby modify the wavelength spectrum.

18. The apparatus of claim 17, wherein the spatial light modulator is further configured to modulate radiation differently in portions of the spatial light modulator contributing to different respective angles of incidence of radiation onto the target.

19. The apparatus of claim 18, wherein:
the optical element is configured to spread different wavelength components across the spatial light modulator exclusively parallel to a first axis, such that each elongate region of the spatial light modulator orthogonal to the first axis receives a different wavelength component;
the optical system is configured such that radiation received by the spatial light modulator at different positions along a second axis of the spatial light modulator contributes to different respective angles of incidence onto the target; and
the modulation of radiation differently in portions of the spatial light modulator contributing to different respective angles of incidence of radiation onto the target comprises modulating radiation non-uniformly as a function of position along the second axis.

20. The apparatus of claim 19, wherein the first axis is orthogonal to the second axis.

* * * * *